US011209495B2

United States Patent
Orlik et al.

(10) Patent No.: US 11,209,495 B2
(45) Date of Patent: Dec. 28, 2021

(54) METHOD AND DEVICE FOR MONITORING A POWER ELECTRONIC ASSEMBLY

(71) Applicant: IAV GmbH Ingenieurgesellschaft Auto und Verkehr, Berlin (DE)

(72) Inventors: Thomas Orlik, Braunschweig (DE); Michael Homann, Vordorf (DE); Jan Klöck, Braunschweig (DE); Heiko Rabba, Braunschweig (DE)

(73) Assignee: IAV GmbH Ingenieurgesellschaft Auto und Verkehr, Berlin (DE)

( * ) Notice: Subject to any disclaimer, the term of this patent is extended or adjusted under 35 U.S.C. 154(b) by 12 days.

(21) Appl. No.: 16/956,291

(22) PCT Filed: Jan. 10, 2019

(86) PCT No.: PCT/DE2019/100017
§ 371 (c)(1),
(2) Date: Jun. 19, 2020

(87) PCT Pub. No.: WO2019/137581
PCT Pub. Date: Jul. 18, 2019

(65) Prior Publication Data
US 2021/0080510 A1 Mar. 18, 2021

(30) Foreign Application Priority Data

Jan. 11, 2018 (DE) ..................... 10 2018 100 518.0

(51) Int. Cl.
*G01R 31/42* (2006.01)
*H03M 3/00* (2006.01)
*G01R 31/34* (2020.01)

(52) U.S. Cl.
CPC ............ *G01R 31/42* (2013.01); *H03M 3/378* (2013.01); *G01R 31/343* (2013.01)

(58) Field of Classification Search
CPC ...... G01R 31/42; G01R 31/343; H03M 3/378
See application file for complete search history.

(56) References Cited

U.S. PATENT DOCUMENTS

| 5,363,039 A | 11/1994 | Kumar et al. |
| 6,291,987 B1 | 9/2001 | Dean et al. |

(Continued)

FOREIGN PATENT DOCUMENTS

| DE | 102005036802 | 4/2007 |
| DE | 102008043114 A1 | 4/2010 |

(Continued)

OTHER PUBLICATIONS

TI Designs,Isolated Current Shunt and Voltage Measurement for Motor Drives Using AM437x. 2015.

(Continued)

*Primary Examiner* — Dominic E Hawkins
(74) *Attorney, Agent, or Firm* — Smartpat PLC

(57) ABSTRACT

A method for monitoring a power electronic assembly is improved to be more effective and versatile. It includes converting and/or modifying an electrical input into at least one electrical output by a conversion and/or modifying process which proceeds in connection with the power electronic assembly. During the conversion and/or modification a bit stream is generated by a delta-sigma modulator and represents the electrical value, that is to say the electrical input or the at least one electrical output. One bit stream each can also be generated by a plurality of delta-sigma modulators and represents the respective electrical value, that is to say the electrical input and the at least one electrical output. The power electronic assembly is monitored based on the one bit stream(s) thus generated and available as a result.

(Continued)

The bit stream(s) is/are not demodulated, and therefore very meaningful information of the corresponding useful signal is provided.

14 Claims, 2 Drawing Sheets

(56) References Cited

U.S. PATENT DOCUMENTS

| | | | |
|---|---|---|---|
| 9,276,792 B1* | 3/2016 | Makinwa | H03L 1/022 |
| 9,797,853 B2 | 10/2017 | Mueller | |
| 2006/0164273 A1* | 7/2006 | Hickling | H03M 3/324 |
| | | | 341/143 |
| 2010/0254515 A1 | 10/2010 | Iijima et al. | |
| 2011/0050472 A1* | 3/2011 | Melanson | H03M 3/474 |
| | | | 341/143 |
| 2013/0069570 A1 | 3/2013 | Chen et al. | |
| 2013/0278197 A1* | 10/2013 | Sasaki | H02P 23/00 |
| | | | 318/490 |
| 2013/0314014 A1 | 11/2013 | Tremel et al. | |
| 2014/0049152 A1* | 2/2014 | Baldwin | H01J 21/20 |
| | | | 313/306 |
| 2017/0179844 A1* | 6/2017 | Schumacher | H03M 7/3082 |
| 2019/0170825 A1* | 6/2019 | Chae | G01R 27/02 |

FOREIGN PATENT DOCUMENTS

| | | |
|---|---|---|
| DE | 102009057043 A1 | 6/2011 |
| DE | 102012216103 A1 | 3/2013 |
| DE | 102012210661 A1 | 12/2013 |
| DE | 102012210662 A1 | 12/2013 |
| DE | 102014203608 A1 | 8/2015 |
| DE | 102014108667 A1 | 12/2015 |
| EP | 1705493 A1 | 9/2006 |
| EP | 3109651 A1 | 12/2016 |
| WO | 9411747 A1 | 5/1994 |
| WO | 0131770 A1 | 5/2001 |
| WO | 2012055937 A3 | 10/2012 |
| WO | 2013176708 A1 | 11/2013 |
| WO | 2015193439 A1 | 12/2015 |

OTHER PUBLICATIONS

Degrenne, Nicolas et al. "A Review of Prognostics and Health Management for Power Semiconductor Modules." (2015).

Dr Li Ran, Condition Monitoring in Power Electronics. Nov. 26, 2015.

V Pickert, Dr B Ji. In-situ Health Monitoring for Power Electronics Modules. Newcastle University. Feb. 20, 2014.

Homann, Michael. "Hochdynamische Strom-und Spannungsregelung von permanenterregten Synchronmaschinen auf Basis von Delta-Sigma Bitströmen." Abstract, p. XII. (2016).

Nussbaumer, Peter et al. "Analysis of current reaction on inverter-switching to detect changes in electrical machine's high-frequency behavior." IECON 2012—38th Annual Conference on IEEE Industrial Electronics Society (2012): 1678-1683.

Nussbaumer, Peter et al. "Online detection of insulation degradation in inverter fed drive systems based on high frequency current sampling." IECON 2011—37th Annual Conference of the IEEE Industrial Electronics Society (2011) 1954-1959.

* cited by examiner

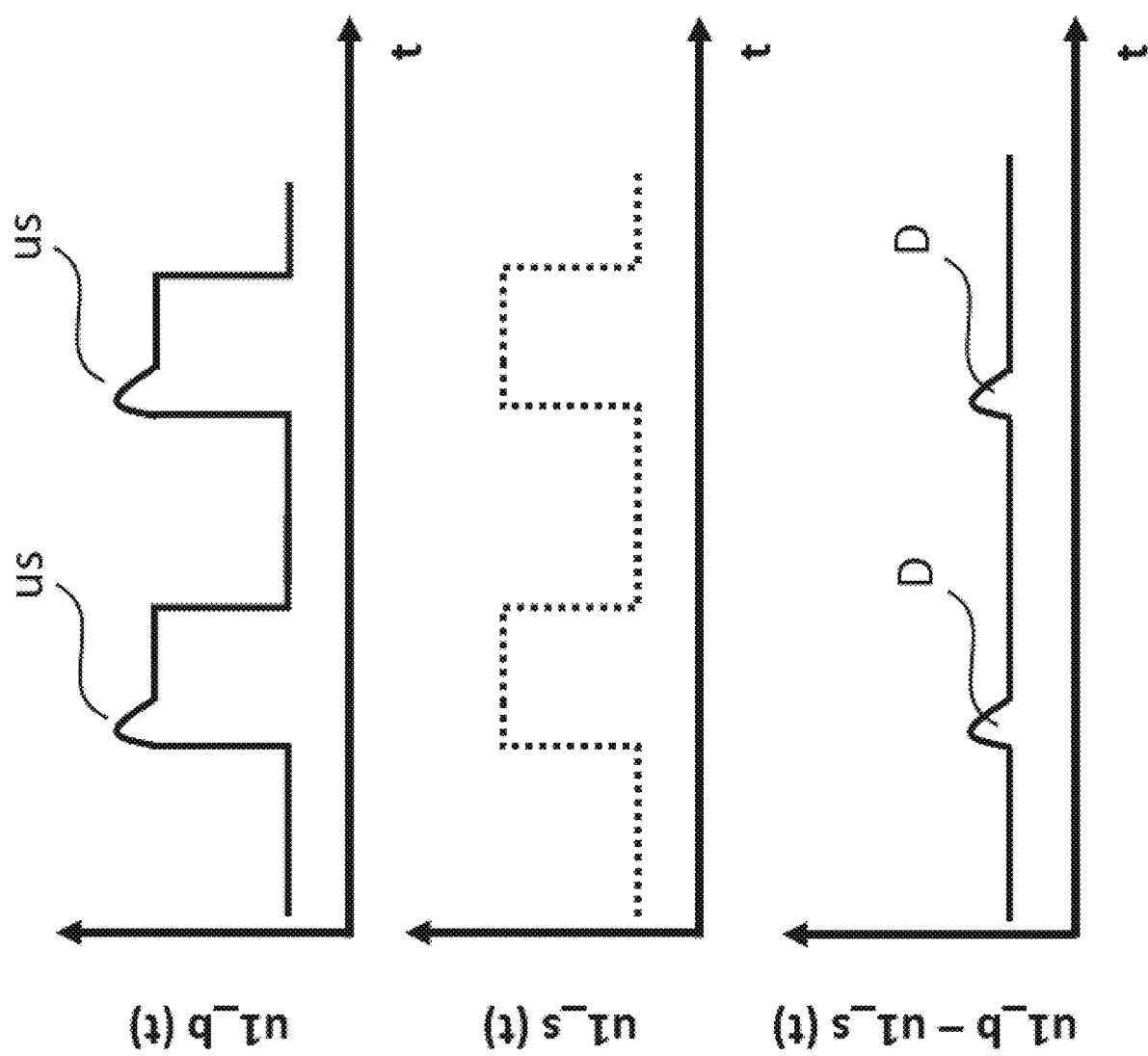

METHOD AND DEVICE FOR MONITORING A POWER ELECTRONIC ASSEMBLY

TECHNICAL FIELD

The present disclosure relates to a method and a device for monitoring a power electronic assembly.

BACKGROUND

Monitoring the status of a power electronic assembly, such as an inverter, is state of the art according to document WO2001031770A1. A specific test sequence is described, wherein a plurality of switching electronic components or switches of such power electronic assembly are switched on in a test mode that is different from the normal operation of the inverter, while other switches are switched off or opened, as the case may be.

As described, for example, in document WO1994011747A1, a test is carried out before an inverter is put in operation.

According to the state of the art, it is a disadvantage that monitoring of a power electronic assembly with switching electronic components, in this case an inverter, is not carried out during the actual operation of the inverter, that is to say not during the conversion of the type of current that is fed in (direct current) into the other type of current (alternating current). As such, a monitoring of the inverter is not carried out in real time and an early detection of errors is not ensured.

SUMMARY

It is the object of the present disclosure to improve the monitoring of a power electronic assembly to be more effective and versatile.

This object is achieved by converting and/or modifying an electrical value by a power electronic assembly. That is to say, the electrical value first corresponds to an electrical input which is later converted into at least one electrical output by a conversion and/or modification process which proceeds in conjunction with the power electronic assembly. During such conversion and/or modification a bit stream is generated by a delta-sigma modulator which represents the electrical value, that is to say the electrical input or the at least one electrical output. Of course, one bit stream each can also be generated by a plurality of delta-sigma modulators and represent the respective electrical value, that is to say the electrical input and the at least one electrical output. The power electronic assembly is monitored based on the one or more bit stream(s) thus generated and available as a result. It is essential that the bit stream(s) is/are not demodulated, and therefore very meaningful information of the corresponding useful signal is provided.

This enables the real-time monitoring of a power electronic assembly. In particular, the behavior of a power electronic assembly with switching components can be analyzed or monitored in real time, that is to say during the operation of the power electronic assembly, thus during the conversion and/or modification process described. On the one hand, a status monitoring of this assembly can be carried out on the basis of the data obtained in a manner according to the disclosure or the bit stream(s) during the conversion/modification of the electrical input into the at least one electrical output by a power electronic assembly. On the other hand, however, early fault detection is also possible, as a function of the data obtained in a manner according to the disclosure or on the basis of the bit stream(s) during the conversion/modification of the electrical input into the at least one electrical output.

Furthermore, it is provided to carry out pattern recognition on the basis of the data obtained in a manner according to the disclosure or on the basis of the bit stream(s) during the conversion/modification of the electrical input.

Thereby, a load indicator relating to the power electronic assembly can be a result of the pattern recognition. As a function of the load indicator, a service life indicator for the power electronic assembly can be formed, which decreases over the operating time of the power electronic assembly. Such a service life indicator can also be formed as a function of a plurality of load indicators. An additional load indicator corresponds, for example, to a dissipation loss of a half-bridge of an inverter and is formed on the basis of the bit stream(s) that is/are each provided by a delta-sigma modulator. An additional load indicator can be a dissipation loss of a capacitor that is arranged in the intermediate circuit of an inverter. The influence of the individual load indicators on the service life indicator can be weighted; that is to say, one load indicator can have a stronger effect on the service life indicator than the other load indicators.

A device for carrying out the method is also proposed, which comprises the power electronic assembly to be monitored and at least one delta-sigma modulator.

Further advantageous embodiments are shown in the following example and the dependent patent claims. Thereby, the application of a delta-sigma pulse width modulation is described as an example. However, the approach is also applicable in connection with a conventional pulse width modulation.

BRIEF DESCRIPTION OF THE DRAWINGS

FIG. 2 shows various voltages in the power electronic assembly over time.

DETAILED DESCRIPTION

Figure 1:
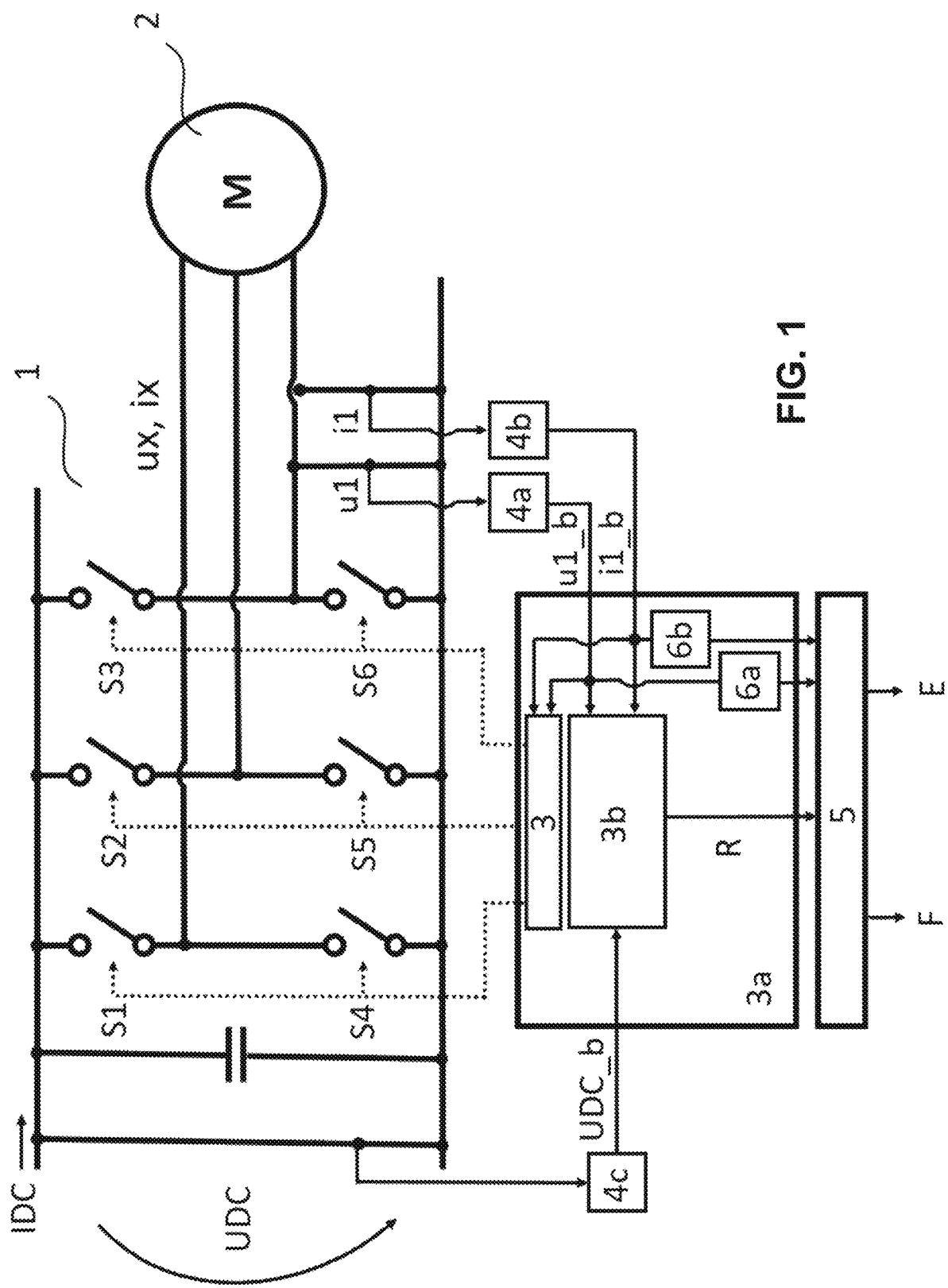
FIG. 1 is a circuit diagram of a power electronic assembly.

A power electronic assembly 1 corresponds in particular to a power electronic actuator that comprises switching components, wherein, by the power electronic assembly 1, an electrical input is converted into at least one electrical output, for example a direct voltage into a single-phase or multi-phase alternating voltage. That is to say, the electrical input is influenced such that at least one electrical output is available which deviates from or differs from, as the case may be, the electrical input, in particular with regard to the type of current (direct current, alternating current) and/or parameters such as amplitude, frequency and/or number of phases. As shown in FIG. 1, the use and monitoring of a power electronic assembly 1, which comprises switching electronic components, is carried out, for example in connection with the operation of a mechatronic system. Thereby, the power electronic assembly 1 comprises a power converter/converter with power semiconductors (IGBT, MOSFET, GTO . . . ). As is generally known, a converter is a power electronic assembly 1 for the purpose of converting an electrical input/type of electrical current fed in (direct current, alternating current) into an electrical output/type of current or for the purpose of modifying characteristic parameters such as the number of phases, voltage and frequency.

In the present example, the mechatronic system comprises an electric machine 2. For example, the electric machine 2 is a permanently excited synchronous machine with three phases. The mechatronic system shown in FIG. 1 is preferably used to drive a vehicle. The control or regulation of the electric machine 2 or the operation of the power converter is carried out, for example, in conjunction with a delta-sigma pulse width modulator 3 ("delta-sigma PWM modulator"), which provides pulse width modulated (PWM) signals S1-S6 with a variable switching frequency, such that the power semiconductors of the inverter are actuated in such a manner that phase potentials ux that are adjustable in terms of magnitude and frequency are available and associated phase currents ix are generated. The structure and the mode of operation of such a delta-sigma pulse width modulator 3 is known to the specialist, for example, according to DE102014108667A1, WO2015193439A1 or Homann, Michael: "Hochdynamische Strom- and Spannungsregelung von permanenterregten Synchronmaschinen auf Basis von Delta-Sigma Bitströmen" ("Highly dynamic current and voltage control of permanently excited synchronous machines based on delta-sigma bit currents"), 2016. The entire content of these documents is incorporated into the present disclosure by reference. Of course, the control and/or regulation of the electrical machine 2 or the operation of the converter can also be carried out in conjunction with conventional pulse width modulation. Preferably, the delta-sigma pulse width modulator 3 is a component of a first processing unit 3a or is realized in connection with such a first processing unit 3a. The first processing unit 3a is in particular an FPGA (field programmable gate array).

As explained, the power converter/inverter corresponds to a power electronic assembly 1 with switching electronic components, in this case the power semiconductors, to which the signals S1-S6 described are fed. By the inverter, the direct voltage UDC/the electrical input is converted/modified into an alternating voltage u/the electrical output, that is to say into a plurality of alternating voltages ux/a plurality of electrical outputs. The direct voltage UDC is provided, for example, by means of an electrical storage device and the alternating voltage u/the alternating voltages ux serve(s) to drive the electrical machine 2. Of course, the direct voltage UDC can also be provided by means of a rectifier.

As shown in FIG. 1, for example, a phase potential u1 and the associated induced phase current i1 are each measured by means of a delta-sigma modulator 4a, 4b. That is to say, the delta-sigma modulator 4a is used to convert the analog phase voltage u1 into a digital bit stream u1_b and the delta-sigma modulator 4b is used to convert the analog phase current i1 into a digital bit stream i1_b. Of course, all phase potentials ux/phase currents ix can be or will be, as the case may be, determined/converted/measured/generated in this way, such that digital bit streams ux_b, ix_b are available, which, for better clarity, is not shown/described here. As is generally known, the closed control loop of the respective delta-sigma modulator 4a, 4b ensures that the relevant output u1_b, i1_b of the delta-sigma modulator 4a, 4b follows the corresponding analog input; that is to say, in this case, it follows the analog phase voltage u1 or the analog phase current i1.

Thus, high-resolution, high-sampled or over-sampled, as the case may be, bit streams u1_b, i1_b are available, which respectively represent the phase voltage u1 or the phase current i1, as the case may be. Since the respective delta-sigma modulator 4a, 4b samples the associated analog input u1, i1 at high frequency or at a very high sampling rate/clock rate, as the case may be, in particular at a frequency in a range from 10 to 100 MHz, preferably at a frequency of 50 MHz, a high-frequency, pulse (density) modulated bit stream u1_b, i1_b is generated at its output. The corresponding bit stream u1_b, i1_b consequently contains meaningful information of the corresponding useful signal u1, i1. Demodulation of the output of the delta-sigma modulator 4a or of the delta-sigma modulator 4b, as the case may be, that is to say of the respective bit stream u1_b, i1_b, is not initially carried out, such that the respective output is processed immediately/directly, for the purpose of monitoring a power electronic assembly 1/the power converter/the inverter. The operation of the power converter or the control and/or regulation of the electrical machine 2, as the case may be, that is to say the formation of the signals S1-S6, is carried out according to the example dealt with here (application of a delta-sigma pulse width modulation) likewise on the basis of the bit streams u1_b, i1_b, which are provided by the delta-sigma modulators 4a, 4b and fed to the delta-sigma pulse width modulator 3. The processing of the bit streams u1_b, i1_b for monitoring the inverter is carried out as shown in FIG. 1 by the first processing unit 3a, preferably by an additional processing unit 3b, which is a component of the first processing unit 3a. In other words, the bit streams u1_b, i1_b represent status or actual values relevant for the operation of the underlying mechatronic system or the underlying power electronic assembly 1, as the case may be.

A processing of the bit streams u1_b, i1_b is carried out in particular insofar as specific similarities and/or repetitions are recognized in the bit streams u1_b, i1_b. The processing of the bit streams u1_b, i1_b, that is to say the monitoring of the power electronic assembly 1, thus includes a pattern recognition, that is to say a recognition of a modified or modifying behavior of the underlying power electronic assembly 1/power converter/inverter. A suitable method for pattern recognition is carried out in summary form on the basis of the bit streams u1_b, i1_b available at the output of the delta-sigma modulators 4a, 4b. Details of this pattern recognition and the formation of additional indicators/characteristic values/results R relevant for monitoring the underlying power electronic assembly 1 will be dealt with in more detail according to a further presentation of the basic relationships in FIG. 1.

As also shown in FIG. 1, an additional delta-sigma modulator 4c is used to convert the analog intermediate circuit voltage UDC into a digital bit stream UDC_b. As shown in FIG. 1, the bit stream UDC_b is also processed by the first processing unit 3a, preferably by an additional processing unit 3b, which is a component of the first processing unit 3a. The bit stream UDC_b is also available for the formation of further indicators/characteristic values/results R relevant for monitoring the underlying power electronic assembly 1.

The at least one result R of the pattern recognition is then fed into an even further processing unit 5. That is to say, the indicators/characteristic values/results R formed on the basis of the pattern recognition and relevant for monitoring the underlying power electronic assembly 1 are transmitted to the processing unit 5/read in there. The processing unit 5 corresponds in particular to a microcontroller. By the processing unit 5, an evaluation/assessment of transmitted results R of the pattern recognition is carried out. By a diagnosis/monitoring function implemented in connection with the processing unit 5, an error reaction F (error display) and/or substitute reaction E (switchover to emergency operation) is initiated in the further course of the process.

As also shown in FIG. 1, the bit streams u1_b, i1_b are also demodulated, in particular by suitable low-pass filters 6a, 6b. Such signals, reduced to a specific useful frequency, such as 10 kHz, can then be further processed as required, but are used in particular in the control/regulation of the relevant mechatronic system.

A pattern recognition for monitoring the underlying power electronic assembly 1, that is to say the inverter under consideration here, is carried out by processing the bit streams u1_*b*, i1_*b*, that is to say the output of the relevant delta-sigma modulator 4*a*, 4*b*, for example by analyzing the behavior of the switching components, thus say the power semiconductors, with regard to possible changes. In other words, the switching behavior of the switches of the inverter is monitored. The recognition of a behavior that has modified, for example, within a first defined period of time (short-term view) or a behavior that has modified, for example, within a further defined period of time (long-term view), as the case may be, wherein the first period of time is shorter than the further period of time, is carried out, for example, by comparing target values and actual values, wherein the actual values correspond to the bit streams u1_*b*, i1_*b* or ux_b, ix_b, as the case may be, which have not (yet) been demodulated. Thus, such a comparison can concern, for example, one or more phase voltages ux and/or phase currents ix and/or dead times. Such a comparison can also concern, for example, the symmetry of the half-bridges of the inverter with respect to each other; in particular, it relates to a comparison of (current and/or voltage) actual values at one switch of a half-bridge and (current and/or voltage) actual values at the additional switch of such half-bridge or an analysis of the commutation, wherein, in each case, the bit streams u1_*b*, i1_*b* or ux_b, ix_b, as the case may be, which are not (yet) demodulated, form the basis. The recognition of a modified or modifying behavior cannot or cannot only be carried out by a comparison of target values and actual values, but alternatively or additionally by the formation of a difference D between a (temporal) ideal/reference curve and the bit streams ux_b, ix_b or u1_*b*, i1_*b*, as the case may be, which are available for further processing. Thereby, it is possible to form the difference D from the target and actual voltage or target and actual current with a sign and/or in terms of amount and thus, if necessary, to obtain two variants of at least one result R of the pattern recognition or, as the case may be, to open up a possibility to counteract a partial elimination of differences D with a signed consideration, which can be achieved by a (parallel) consideration in terms of amount.

Such a pattern recognition is achieved by forming a difference D between an ideal/reference curve, such as the curve of the target value of the phase voltage u1_*s* schematically represented by a dotted line in FIG. 2, and the curve of the actual value of the phase voltage u1_*b* represented by a solid line, that is to say the bit stream u1_*b* sampled at high resolution by the delta-sigma modulator 4*a*. Of course, a difference D can also be formed between an ideal/reference curve/curve of the target value of the phase current i1_*s* and the curve of the actual value of the phase current i1_*b*, that is to say the bit stream i1_*b* sampled at high resolution using the delta-sigma modulator 4*b*. As can be seen in FIG. 2, there are differences D between the curve of the target value of the phase voltage u1_*s* and the curve of the actual value of the phase voltage u1_*b* in that the curve of the actual value of the phase voltage u1_*b* has voltage peaks us, which are caused by switching on the switches of the relevant half-bridge of the inverter. Such voltage peaks us only occur over a very short period of 1 to 2 microseconds and also change very often irregularly within this period; that is to say, the phase voltage u1_*b* oscillates at a high frequency during this period, which is not shown in FIG. 2.

On the basis of such difference formation D, which in particular is averaged over a defined time or a large number of switching operations, as the case may be, a result R of the pattern recognition can arise such that, if the amount or value of the difference D is compared with a threshold or limit value, as the case may be, the threshold is exceeded/the limit value is violated. The result R is then fed to the processing unit 5 or to a diagnostic/monitoring function and, based on this, an error reaction F (error display) and/or substitute reaction E (switchover to emergency operation) is initiated. Environmental conditions are taken into account in the described pattern recognition. In particular, measuring/modeled temperature values are taken into account.

The result R, which arises from a pattern recognition as described, can be interpreted as a load indicator of the power electronic assembly 1 or a component of such assembly 1. In other words, the result R is a characteristic value that represents a specific load on the power electronic assembly 1 or a component of such assembly 1. In particular, in conjunction with the processing unit 5, a service life indicator can be formed as a function of the result R/such characteristic value. Such service life indicator is formed in such a manner that it decreases over time or over the operating time, as the case may be.

In one embodiment, the service life indicator is formed as a function of a plurality of load indicators. That is to say, in addition to the first load indicator, which is formed on the basis of the pattern recognition/the at least one result R, additional load indicators are taken as a basis for the formation of the service life indicator. In other words, a large number of load indicators are combined to form a service life indicator. The influence of the individual load indicators on the service life indicator can be of varying degrees or is determined individually, as the case may be. In other words, a weighting of the load indicators, which underlies the formation of the basis of the life cycle indicator, is carried out.

Each individual load indicator is a characteristic value that represents a specific load on the power electronic assembly 1 or a component of the assembly 1. An additional load indicator corresponds to or relates to, as the case may be, a dissipation loss related to a half-bridge of a power converter/inverter. Such dissipation loss is calculated in particular as a function of the phase current ix and the voltage at at least one switch or the phase voltage ux of the relevant half-bridge, as the case may be. The calculation of such dissipation loss is also advantageously carried out on the basis of the (high-resolution) bit streams ux_b, ix_b or u1_*b*, i1_*b*, as the case may be, which are provided by means of the delta-sigma modulators 4*a*, 4*b*. In practice, such quantities are multiplied at the bit stream level in the high-frequency raster, such that the dissipation loss in the switching process is determined, wherein, for the upper switches shown in FIG. 1, a voltage drop of UDC_b minus ux_b arises in each case. Such a difference formation is only possible since high-resolution bit streams are available. It is advantageous that no filtering of the bit stream ix_b concerning the phase current ix or of the bit stream ux_b concerning the phase voltage ux, as the case may be, is carried out before multiplying such quantities, since this would only provide the stationary losses due to voltage drops. Environmental conditions are also taken into account when determining the load indicator concerning a specific load/dissipation loss. In particular, measured and modeled temperature values are taken into account. That is to say, to the extent available, temperature measurements from the power electronics in the housing or on the circuit board are used as load indicators. These influence the load indicator regarding the dissipation loss of a half-bridge, because the warmer the environment, the more the influences of dissipation loss have to be weighted.

An additional load indicator relates to the ripple current load of the capacitor, which is arranged in the intermediate circuit of a power converter/inverter. The ripple current is preferably determined as a function of the direct current IDC in the intermediate circuit. This can either be measured by means of an additional delta-sigma modulator, which, for a better overview, is not shown in FIG. 1, such that a digital bit stream IDC_b is available, or it can be determined from the superposition of the phase currents ix_b with the assistance of the switching patterns. The ripple current is then determined by a (high-frequency) differential formation of the digital bit stream IDC_b and an average value of IDC over one period. Subsequently, the RMS value of the ripple current is preferably determined and used as a load indicator. In particular in conjunction with the use of a delta-sigma pulse width modulator 3, as described in connection with FIG. 1, the switching frequency must be taken into account when determining such dissipation loss, or an evaluation of the ripple with respect to the switching frequency must be carried out, as the case may be. That is to say, the higher the switching frequency, the smaller the ripple. It is therefore useful to determine the ripple as a function of the switching frequency. Environmental conditions are also taken into account when determining the load indicator with respect to a dissipation loss of the intermediate circuit capacitor. In particular, measuring/modeled temperature values are taken into account. That is to say, to the extent available, temperature measured values from the power electronics in the housing or on the circuit board of the assembly 1 are used as load indicators.

In summary, upon the formation of the service life indicator, it becomes clear that the processing of (not yet demodulated) bit streams, that is to say the respective output of a delta-sigma modulator, is advantageous, since in this way the continuous monitoring of a mechatronic system/power electronic assembly 1 with great precision is possible.

The invention claimed is:

1. A method for monitoring a power electronic assembly, comprising:
   converting an electrical input into an electrical output;
   generating, by a delta-sigma modulator, a bit stream which represents the electrical input or the electrical output while converting the electrical input into the electrical output; and
   monitoring the power electronic assembly based on the bit stream,
   wherein the bit stream is not demodulated.

2. The method according to claim 1,
   wherein monitoring the power electronic assembly includes recognizing a pattern in the bit stream.

3. The method according to claim 2,
   wherein recognizing a pattern in the bit stream is carried out by comparing target values and actual values with one another,
   wherein the actual values correspond to the bit stream.

4. The method according to claim 2, further comprising:
   generating a result based on recognizing a pattern in the bit stream;
   calculating a load indicator relating to the power electronic assembly; and
   calculating, as a function of the load indicator, a service life indicator relating to the power electronic assembly which decreases over an operating time of the power electronic assembly.

5. The method according to claim 4,
   wherein the service life indicator is calculated as a function of a plurality of load indicators.

6. The method according to claim 5,
   wherein the plurality of load indicators includes an additional load indicator which corresponds to a dissipation loss of a half-bridge of an inverter, and
   wherein the additional load indicator is calculated based on the bit stream.

7. The method according to claim 5,
   wherein the plurality of load indicators includes a further load indicator which corresponds to a ripple current load of a capacitor that is arranged in an intermediate circuit of an inverter.

8. The method according to claim 5,
   wherein an influence of individual ones of the plurality of load indicators on the service life indicator is weighted.

9. A device, wherein the device performs the method as in claim 1.

10. A vehicle comprising the device according to claim 9.

11. A method for monitoring a power electronic assembly, comprising:
    converting an electrical input into at least one electrical output;
    generating, by a plurality of delta-sigma modulators, bit streams which represent the electrical input and the at least one electrical output while converting the electrical input into the at least one electrical output; and
    monitoring the power electronic assembly based on the bit streams,
    wherein the bit streams are not demodulated.

12. A method for monitoring a power electronic assembly, comprising:
    converting an electrical input into at least one electrical output;
    generating, by at least one delta-sigma modulator, at least one bit stream which represents the electrical input and/or the at least one electrical output while converting the electrical input into the at least one electrical output; and
    monitoring the power electronic assembly based on the at least one bit stream,
    wherein the at least one bit stream is not demodulated.

13. The method as in claim 12,
    wherein the bit stream is pulse modulated.

14. The method as in claim 12, further comprising:
    feeding the bit stream to a processing unit.

* * * * *